(12) United States Patent
Ko

(10) Patent No.: US 9,905,792 B2
(45) Date of Patent: Feb. 27, 2018

(54) ORGANIC LIGHT EMITTING DIODE AND ORGANIC LIGHT EMITTING DIODE DISPLAY INCLUDING THE SAME

(71) Applicant: Samsung Display Co., Ltd., Yongin-si, Gyeonggi-do (KR)

(72) Inventor: Hee Joo Ko, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/164,782

(22) Filed: May 25, 2016

(65) Prior Publication Data

US 2017/0033169 A1 Feb. 2, 2017

(30) Foreign Application Priority Data

Jul. 28, 2015 (KR) .................. 10-2015-0106420

(51) Int. Cl.
| | | |
|---|---|---|
| *H01L 29/08* | (2006.01) | |
| *B32B 9/00* | (2006.01) | |
| *H01L 51/50* | (2006.01) | |
| *H01L 51/00* | (2006.01) | |
| *H01L 51/52* | (2006.01) | |

(52) U.S. Cl.
CPC ...... *H01L 51/5092* (2013.01); *H01L 51/5004* (2013.01); *H01L 51/007* (2013.01); *H01L 51/0056* (2013.01); *H01L 51/0058* (2013.01); *H01L 51/0067* (2013.01); *H01L 51/0072* (2013.01); *H01L 51/5072* (2013.01); *H01L 51/5256* (2013.01); *H01L 2251/552* (2013.01)

(58) Field of Classification Search
CPC ............. H01L 51/5004; H01L 51/5092; H01L 51/5072; H01L 51/0056; H01L 51/0058; H01L 51/0067; H01L 51/0072; H01L 51/007; H01L 51/5256; H01L 2251/552
USPC ................... 257/40, E51.026; 428/690, 917
See application file for complete search history.

(56) References Cited

U.S. PATENT DOCUMENTS

| | | | |
|---|---|---|---|
| 2013/0228753 A1* | 9/2013 | Moon ................. | H01L 51/5004 257/40 |
| 2014/0191206 A1* | 7/2014 | Cho ....................... | C09K 11/06 257/40 |

FOREIGN PATENT DOCUMENTS

| | | |
|---|---|---|
| KR | 10-1108215 B1 | 1/2012 |
| KR | 10-2013-0048170 A | 5/2013 |
| KR | 10-2013-0070201 A | 6/2013 |
| KR | 10-2013-0100635 A | 9/2013 |

* cited by examiner

*Primary Examiner* — William K Cheung
(74) *Attorney, Agent, or Firm* — Lewis Roca Rothgerber Christie LLP

(57) ABSTRACT

An organic light emitting element according to an example embodiment of the present disclosure includes: a first electrode and a second electrode facing each other; an emission layer between the first electrode and the second electrode; an electron transport layer between the emission layer and the second electrode; and a buffer layer between the emission layer and the electron transport layer, wherein the buffer layer includes a first material having a higher LUMO level than that of the electron transport layer.

17 Claims, 7 Drawing Sheets

ORGANIC LIGHT EMITTING DIODE AND ORGANIC LIGHT EMITTING DIODE DISPLAY INCLUDING THE SAME

CROSS-REFERENCE TO RELATED APPLICATION

This application claims priority to and the benefit of Korean Patent Application No. 10-2015-0106420 filed in the Korean Intellectual Property Office on Jul. 28, 2015, the entire content of which is incorporated herein by reference.

BACKGROUND

1. Field

One or more aspects of embodiments of the present disclosure relate to an organic light emitting element and an organic light emitting diode display including the same.

2. Description of the Related Art

Recently, because a decrease in weight and thickness of monitors, television sets, and so on has been requested, a cathode ray tube (CRT) technology has been replaced with a liquid crystal display (LCD). However, because the LCD is a passive light emitting device, it requires an additional backlight. Also, the LCD technology has problems in terms of response speed and viewing angle.

As a display device capable of overcoming at least some of the aforementioned limitations, an organic light emitting device has attracted a lot of attention. The organic light emitting device is a self-emitting display element having advantages such as a wide viewing angle, excellent contrast, and a fast response time.

The organic light emitting device includes an organic light emitting element for light emission, and the organic light emitting element forms excitons by combining electrons injected from one electrode and holes injected from another electrode in an emission layer, and the excitons emit energy such that light is emitted. In an example high efficiency organic light emitting device, when element performance is improved such that a driving current value of the organic light emitting device is more than an initial threshold value, emission efficiency of the element in a low current application region is also increased, which may in turn lead to generation of unstable color expression in a low gray region.

When a low brightness region of the organic light emitting device is controlled by the current, the current efficiency is improved such that a deviation in the driving current of the thin film transistor (TFT) appears as a brightness deviation. For example, color non-uniformity in the low brightness region may be generated in a high efficiency organic light emitting device. For example, such color non-uniformity may frequently be generated in the green organic light emitting element.

The above information disclosed in this Background section is only for enhancement of understanding of the background of the disclosure and therefore it may contain information that does not form the prior art that is already known in this country to a person of ordinary skill in the art.

SUMMARY

One or more aspects of embodiments of the present disclosure are directed towards an organic light emitting element capable of effectively (or suitably) reducing efficiency in a low gray region, while maintaining efficiency and a lifespan in a high gray region, and an organic light emitting diode display including the same.

An organic light emitting element according to an example embodiment of the present disclosure includes: a first electrode and a second electrode facing each other; an emission layer positioned between the first electrode and the second electrode; an electron transport layer positioned between the emission layer and the second electrode; and a buffer layer positioned between the emission layer and the electron transport layer, wherein the buffer layer includes a first material having a lowest unoccupied molecular orbital (LUMO) level that is higher than that of the electron transport layer.

The difference between the LUMO level of the buffer layer and the LUMO level of the electron transport layer may be 0.3 eV or greater.

The first material may be one selected from compounds represented by Chemical Formulae 1 4, and the buffer layer may include at least one selected from the compounds represented by Chemical Formulae 1 4:

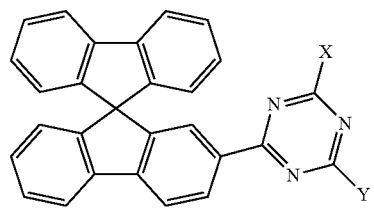

Chemical Formula 1

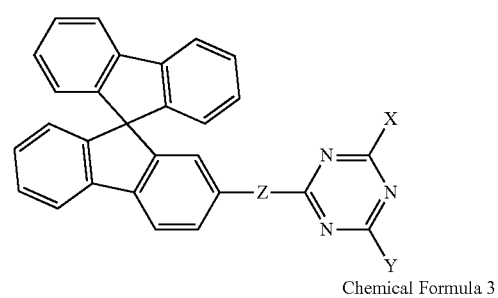

Chemical Formula 2

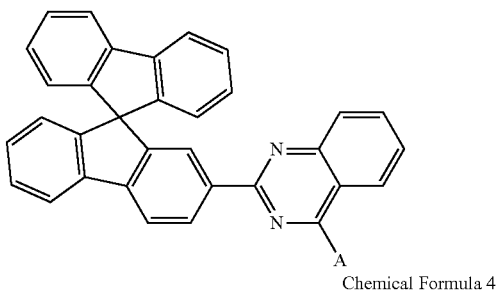

Chemical Formula 3

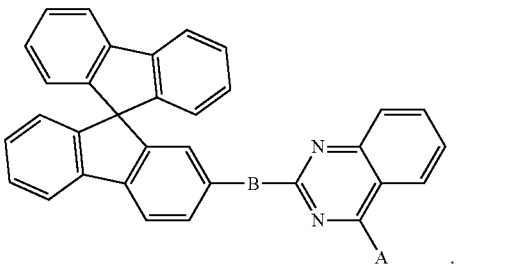

Chemical Formula 4

In Chemical Formula 1 and Chemical Formula 2, X and Y may be each independently selected from:

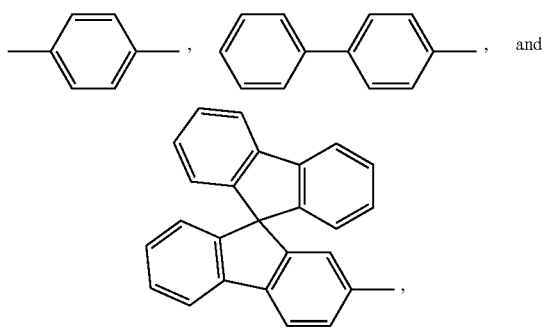

and in Chemical Formula 2, Z may be selected from:

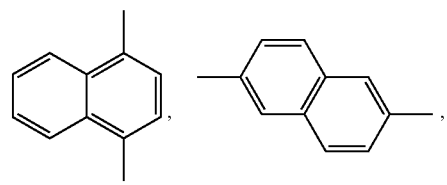

In Chemical Formula 3 and Chemical Formula 4, A may be selected from:

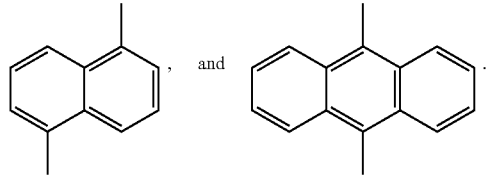

and in Chemical Formula 4, B may be selected from:

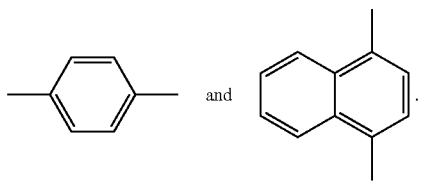

The buffer layer may further include a second material having faster electron mobility than the first material.

The second material may be one selected from compounds represented by Chemical Formulae 5 to 8, and the buffer layer may include at least one selected from the compounds represented by Chemical Formulae 5 to 8:

Chemical Formula 5

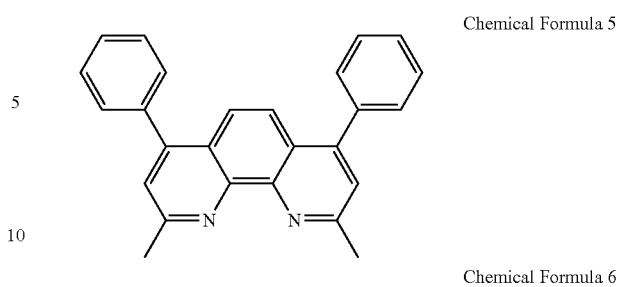

Chemical Formula 6

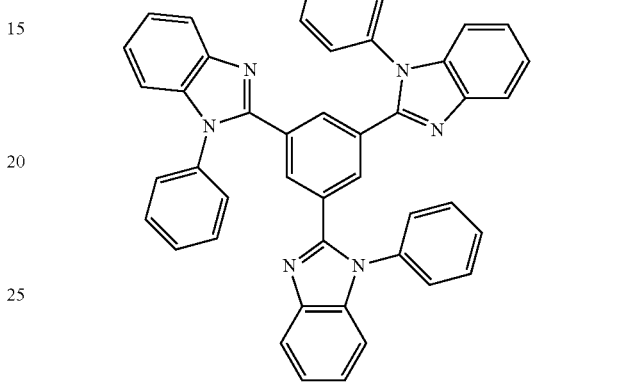

Chemical Formula 7

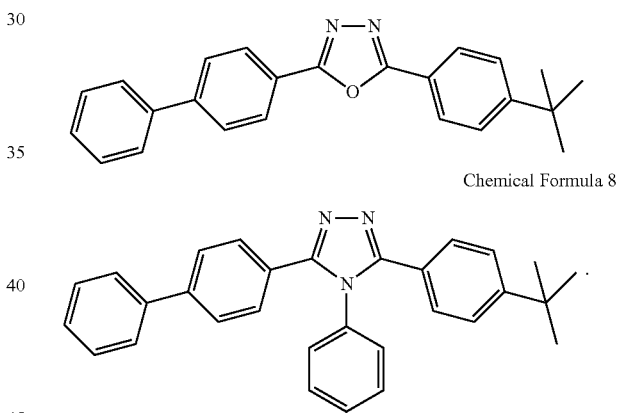

Chemical Formula 8

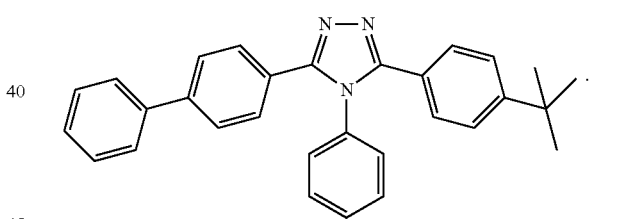

A mixture ratio of the first material and the second material may be 1:9 to 9:1.

The thickness of the buffer layer may be 1 nm to 10 nm.

The organic light emitting element according to an example embodiment of the present disclosure may further include an electron injection layer positioned between the electron transport layer and the second electrode, and a hole transport layer positioned between the first electrode and the emission layer.

The electron mobility of the first material may be slower than the electron mobility of a material included in the electron transport layer.

An organic light emitting diode display according to an example embodiment of the present disclosure includes: a substrate; a thin film transistor positioned on the substrate; and an organic light emitting element coupled to the thin film transistor. The organic light emitting element includes: a first electrode and a second electrode facing each other; an emission layer positioned between the first electrode and the second electrode; an electron transport layer positioned between the emission layer and the second electrode; and a buffer layer positioned between the emission layer and the electron transport layer, and the buffer layer includes a first material having a lowest unoccupied molecular orbital (LUMO) level that is higher than that of the electron transport layer.

The difference between the LUMO level of the buffer layer and the LUMO level of the electron transport layer may be 0.3 eV or greater.

The first material may be one selected from compounds represented by Chemical Formulae 1 to 4, and the buffer layer may include at least one selected from the compounds represented by Chemical Formulae 1 to 4:

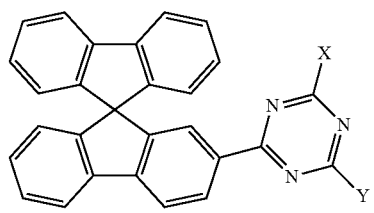

Chemical Formula 1

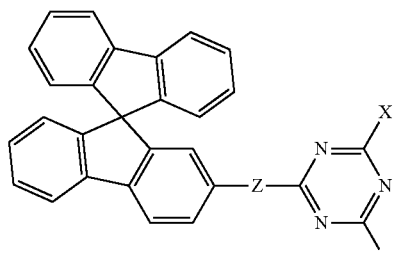

Chemical Formula 2

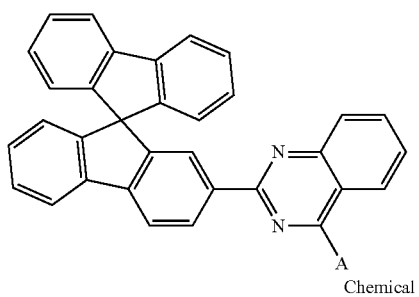

Chemical Formula 3

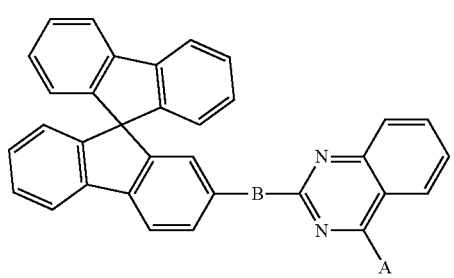

Chemical Formula 4

In Chemical Formula 1 and Chemical Formula 2, X and Y may be each independently selected from:

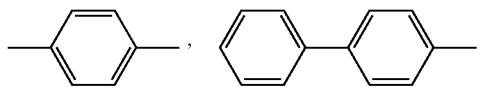

and

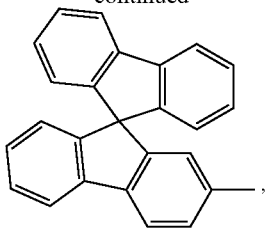

and in Chemical Formula 2, Z may be selected from:

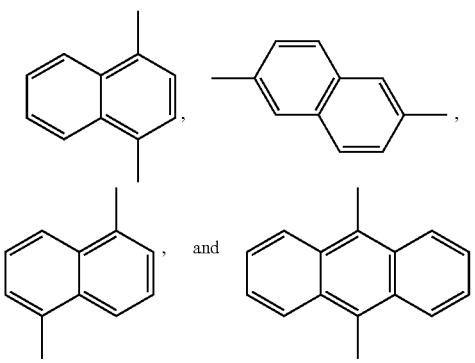

In Chemical Formula 3 and Chemical Formula 4, A may be selected from:

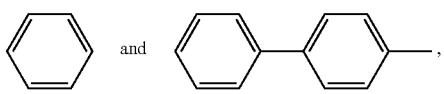

and in Chemical Formula 4, B may be selected from:

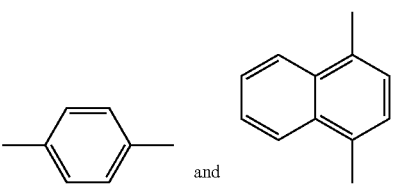

The buffer layer may further include a second material having faster electron mobility than the first material.

The second material may be one selected from compounds represented by Chemical Formulae 5 to 8, and the buffer layer may include at least one selected from the compounds represented by Chemical Formulae 5 to 8:

Chemical Formula 5

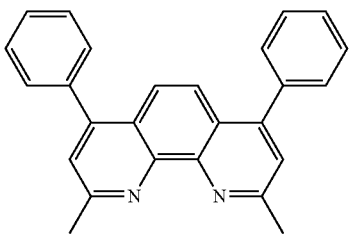

Chemical Formula 6

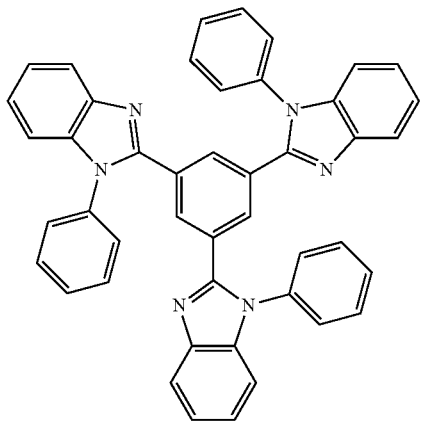

Chemical Formula 7

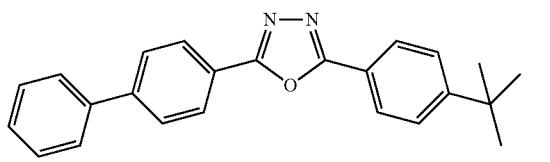

Chemical Formula 8

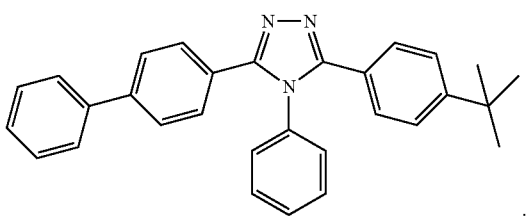

A mixture ratio of the first material and the second material may be 1:9 to 9:1.

The thickness of the buffer layer may be 1 nm to 10 nm.

The organic light emitting diode display according to an example embodiment of the present disclosure may further include an electron injection layer positioned between the electron transport layer and the second electrode, and a hole transport layer positioned between the first electrode and the emission layer.

According to an example embodiment of the present disclosure, an organic light emitting diode display may include high efficiency organic light emitting element capable of maintaining the efficiency and the lifespan in the high gray region, while effectively (or suitably) reducing the efficiency in the low gray region, without generating color non-uniformity in the low gray region.

DETAILED DESCRIPTION

Figure 1:
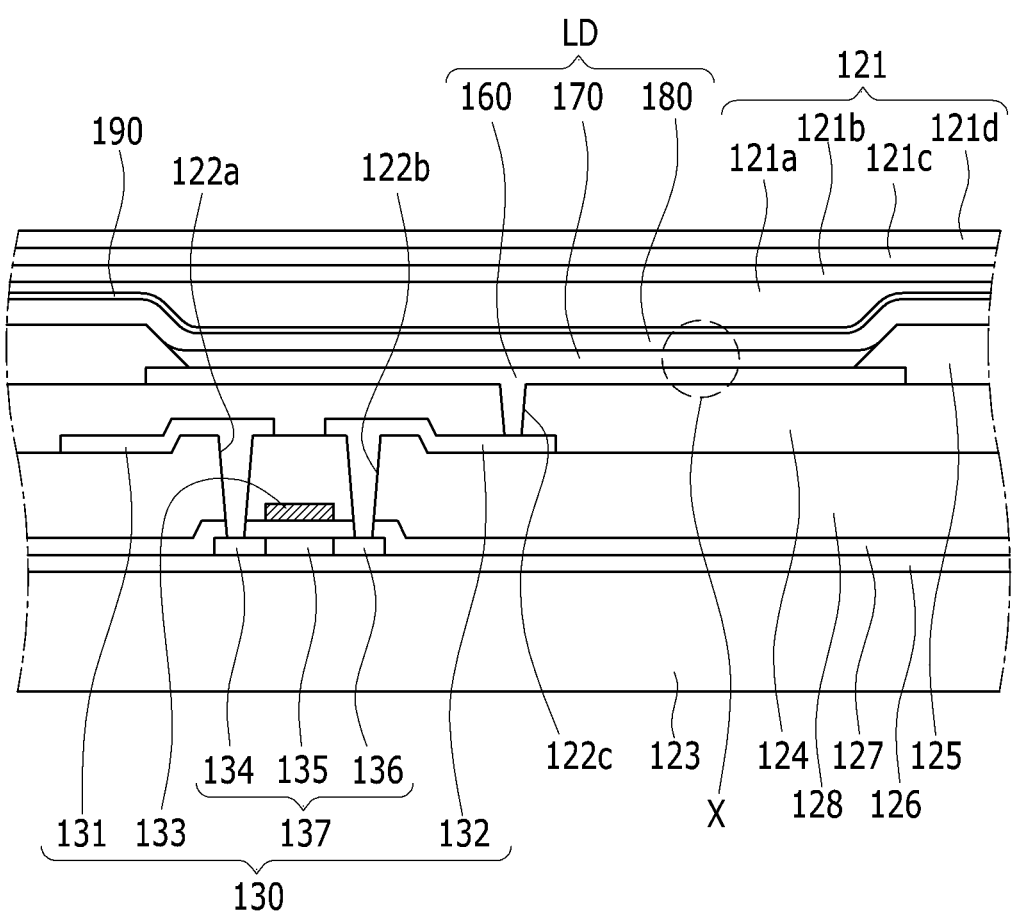
FIG. 1 is a cross-sectional view showing an organic light emitting diode display according to an example embodiment of the present disclosure.

The present disclosure will be described more fully hereinafter with reference to the accompanying drawings, in which example embodiments of the disclosure are shown. As those skilled in the art would realize, the described embodiments may be modified in various different ways, all without departing from the spirit or scope of the present disclosure.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
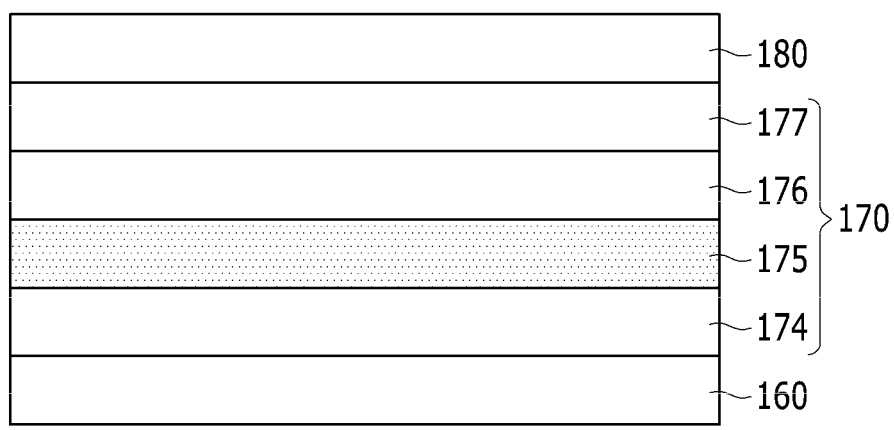
FIG. 2 is an enlarged cross-sectional view of the organic light emitting element of FIG. 1.

FIG. 1 is a cross-sectional view showing an organic light emitting diode display according to an example embodiment of the present disclosure. FIG. 2 is an enlarged cross-sectional view of the organic light emitting element of FIG. 1.

Referring to FIG. 1, a substrate 123 may be made of, for example, an inorganic material such as glass; an organic material such as a polycarbonate, polymethylmethacrylate, polyethylene terephthalate, polyethylene naphthalate, a polyamide, polyether sulfone, or a combination thereof; and/or of a silicon wafer.

In addition, a substrate buffer layer 126 may be provided (e.g., positioned) on the substrate 123. The substrate buffer layer 126 serves to prevent or reduce the penetration of impure elements and to planarize the surface of the substrate 123.

The substrate buffer layer 126 may be made of one or more suitable materials capable of performing the aforementioned functions. For example, the substrate buffer layer 126 may include a silicon nitride (SiNy) layer, a silicon oxide (SiOx) layer, and/or a silicon oxynitride (SiOxNy) layer. However, in some embodiments, the substrate buffer layer 126 may be omitted, depending on a kind of the substrate 123 and its manufacturing process.

In some embodiments, a driving semiconductor layer 137 is formed on the substrate buffer layer 126. The driving semiconductor layer 137 may be formed of a material including polysilicon. The driving semiconductor layer 137 may include a channel region 135 (in which impurities are not doped), and a source region 134 and a drain region 136 (in which impurities are doped) at respective sides of the channel region 135. In this case, doped ion materials (e.g., doped impurities) may be P-type impurities such as boron (B) and/or B2H6. However, the impurities are not limited thereto and may vary according to a kind of thin film transistor.

A gate insulating layer 127, made of a silicon nitride (SiNy) and/or a silicon oxide (SiOx), may be formed on the driving semiconductor layer 137. A gate wire including a driving gate electrode 133 may be formed on the gate insulating layer 127. In some embodiments, the driving gate electrode 133 is formed to overlap at least a part of the driving semiconductor layer 137, for example, the channel region 135.

An interlayer insulating layer 128 covering the driving gate electrode 133 may be formed on the gate insulating layer 127. A first contact hole 122a and a second contact hole 122b, respectively exposing the source region 134 and the drain region 136 of the driving semiconductor 137, may be formed in the gate insulating layer 127 and the interlayer insulating layer 128. Like the gate insulating layer 127, the interlayer insulating layer 128 may be made of a material such as a silicon nitride (SiNy) and/or a silicon oxide (SiOx).

A data wire including a driving source electrode 131 and a driving drain electrode 132 may be provided on the interlayer insulating layer 128. The driving source electrode 131 and the driving drain electrode 132 may be respectively connected (e.g., coupled) with the source region 134 and the drain region 136 of the driving semiconductor layer 137 through the first contact hole 122a and the second contact hole 122b respectively formed in the interlayer insulating layer 128 and the gate insulating layer 127.

According to embodiments of the present disclosure, a driving thin film transistor 130 may include the driving semiconductor layer 137, the driving gate electrode 133, the driving source electrode 131, and the driving drain electrode 132. The driving thin film transistor 130, however, is not limited to the aforementioned example, and may be variously modified to fit any suitable configuration.

In some embodiments, a planarization layer 124 covering the data wire is formed on the interlayer insulating layer 128. The planarization layer 124 may serve to remove or reduce a step and planarize the surface on which an organic light emitting element is to be formed, in order to increase emission efficiency of the organic light emitting element. In some embodiments, the planarization layer 124 has a third contact hole 122c exposing a part of the drain electrode 132.

The planarization layer 124 may be made of one or more materials selected from a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

An example embodiment according to the present disclosure is not limited to the aforementioned structure, and in some embodiments, one of the planarization layer 124 and the interlayer insulating layer 128 may be omitted.

A first electrode of the organic light emitting element, for example, a pixel electrode 160, may be formed on the planarization layer 124. In some embodiments, the organic light emitting diode device includes a plurality of pixel electrodes 160 which are disposed (e.g., positioned) for every plurality of pixels, respectively. In this case, the plurality of pixel electrodes 160 may be spaced apart from each other. The pixel electrode 160 may be connected to the drain electrode 132 through the third contact hole 122c of the planarization layer 124.

A pixel defining layer 125 may be formed on the planarization layer 124 and may have an opening exposing the pixel electrode 160. In some embodiments, the pixel defining layer 125 has a plurality of openings formed for each pixel. In this case, a light-emitting element layer 170 may be formed for each opening formed by the pixel defining layer 125. Accordingly, a pixel area, in which each light-emitting element layer 170 is formed by the pixel defining layer 125, may be defined.

In the above-described example embodiment, the pixel electrode 160 is disposed (e.g., positioned) to correspond to the opening of the pixel defining layer 125. However, the pixel electrode 160 is not necessarily disposed only in the opening of the pixel defining layer 125, but may be disposed below the pixel defining layer 125, such that a part of the pixel electrode 160 overlaps with the pixel defining layer 125.

The pixel defining layer 125 may be made of a resin such as a polyacrylate resin and/or a polyimide, a silica-based inorganic material, and/or the like.

In some embodiments, the light-emitting element layer 170 is formed on the pixel electrode 160. A structure of the light-emitting element layer 170 will be described in more detail hereinafter.

A second electrode (also referred to as the common electrode 180), may be formed on the light-emitting element layer 170. According to embodiments of the present disclosure, an organic light emitting element LD may include the pixel electrode 160, the light-emitting element layer 170, and the common electrode 180.

The pixel electrode 160 and the common electrode 180 may be each independently made of a transparent conductive material, or of a transflective or reflective conductive material. Depending on the materials for forming the pixel electrode 160 and the common electrode 180, the organic light emitting diode device may be a top emission type (e.g., a top emission organic light emitting diode device), a bottom emission type (e.g., a bottom emission organic light emitting diode device), or a double-sided emission type (e.g., a double-sided emission organic light emitting diode device).

An overcoat 190, covering and protecting the common electrode 180, may be formed as an organic layer on the common electrode 180.

In some embodiments, a thin film encapsulation layer 121 is formed on the overcoat 190. The thin film encapsulation layer 121 may serve to encapsulate and protect the organic light emitting element LD and a driving circuit part formed on the substrate 123 from the external environment.

In some embodiments, the thin film encapsulation layer 121 includes organic encapsulation layers 121a and 121c, and inorganic encapsulation layers 121b and 121d, which are alternately laminated. FIG. 1, for example, illustrates the thin film encapsulation layer 121 including two organic encapsulation layers 121a and 121c and two inorganic encapsulation layers 121b and 121d that are alternately laminated, but the thin film encapsulation layer 121 is not limited thereto.

Hereinafter, an organic light emitting element according to an example embodiment of the present disclosure will be described with reference to FIG. 2.

FIG. 2 is an enlarged view of a portion of the organic light emitting element of FIG. 1 denoted as "X." Referring to FIG. 2, the organic light emitting element according to an example embodiment of the present disclosure includes a structure in which a first electrode (e.g., the pixel electrode 160), a hole transport layer 174, an emission layer 175, a buffer layer 176, an electron transport layer 177, and the second electrode 180 are sequentially layered.

When the first electrode 160 according to an example embodiment of the present disclosure is an anode, a material for forming the first electrode 160 may be selected from materials having a high work function, so as to facilitate hole injection. The first electrode 160 may be a transparent electrode or an opaque electrode. When the first electrode 160 is a transparent electrode, it may be formed of indium-tin oxide (ITO), indium-zinc oxide (IZO), tin oxide (SnO2), zinc oxide (ZnO), a conductive oxide, or combinations thereof, or of a metal such as aluminum, silver, and/or magnesium, to a relatively small thickness. When the first electrode 160 is an opaque electrode, it may be formed of a metal such as aluminum, silver, and/or magnesium.

The first electrode 160 may be formed as a multi-layer structure (e.g., having two or more layers) including different materials (e.g., different kinds of materials). For example, the first electrode 160 may be formed to have a structure of ITO/Ag/ITO, in which indium-tin oxide (ITO), silver (Ag), and indium-tin oxide (ITO) are sequentially stacked.

The first electrode 160 may be formed, for example, by sputtering or vacuum deposition.

A hole transport region may be positioned on the first electrode 160. The hole transport region may serve to facilitate the transport of holes transmitted from the first electrode 160 into the emission layer 175 that will be described in more detail later. The hole transport region may include a hole transport layer 174. The hole transport layer 174 may include an organic material. For example, the hole transport layer 174 may include NPD (N,N-dinaphthyl-N, N'-diphenyl benzidine), TPD (N,N'-bis-(3-methylphenyl)-N,N'-bis-(phenyl)-benzidine), s-TAD, MTDATA (4,4',4"-tris(N-3-methylphenyl-N-phenyl-amino)-triphenylamine), and/or the like, but is not limited thereto.

The thickness of the hole transport layer 174 may be 10 nm to 150 nm. For example, the thickness of the hole transport layer 174 may be 50 nm to 100 nm. The emission layer 175 includes a host and a dopant. The emission layer 175 may include a material that emits red light, green light, blue light, and/or white light, and may be formed using a phosphorescent and/or fluorescent material.

When the emission layer 175 emits red light, the emission layer 175 may include a host material that includes CBP (carbazole biphenyl) and/or mCP (1,3-bis(carbazol-9-yl)), and may be formed of a phosphorescent material including at least one selected from PIQIr(acac) (bis(1-phenylisoquinoline)acetylacetonate iridium), PQOr(acac) (bis(1-phenylquinoline)acetylacetonate iridium), PQIr (tris(1-phenylquinoline)iridium), and PtOEP (platinum octaethylporphyrin), or a fluorescent material including PBD:Eu(DBM)3(Phen) and/or perylene, without limitation.

When the emission layer 175 emits green light, the emission layer 175 may include a host material including CBP and/or mCP, and may be made of a phosphorescent material including a dopant material including Ir(ppy)3 (fac-tris(2-phenylpyridine)iridium), and/or a fluorescent material including Alq3 (tris(8-hydroxyquinolino)aluminum), without limitation.

When the emission layer 175 emits blue light, the emission layer 175 may include a host material including CBP and/or mCP, and may be made of a phosphorescent material including a dopant that includes (4,6-F2ppy)2Irpic, without limitation. In some embodiments, the emission layer 175 may be made of a fluorescent material including at least one selected from spiro-DPVBi, spiro-6P, distyrylbenzene (DSB), distyrylarylene (DSA), a PFO-based polymer, and a PPV-based polymer, but is not limited thereto.

A buffer layer 176 may be positioned on the emission layer 175. The buffer layer 176 may include a first material, such that a lowest unoccupied molecular orbital (LUMO) level of the buffer layer 176 according to an example embodiment of the present disclosure is higher than the LUMO level of the electron transport layer 177. Accordingly, the injection degree of the electrons injected from the electron transport layer 177 into the emission layer 175 may be controlled.

For example, the LUMO level of the first material of the buffer layer 176 may be higher than the LUMO level of the electron transport layer 177 by 0.3 eV or greater.

Figure 3:
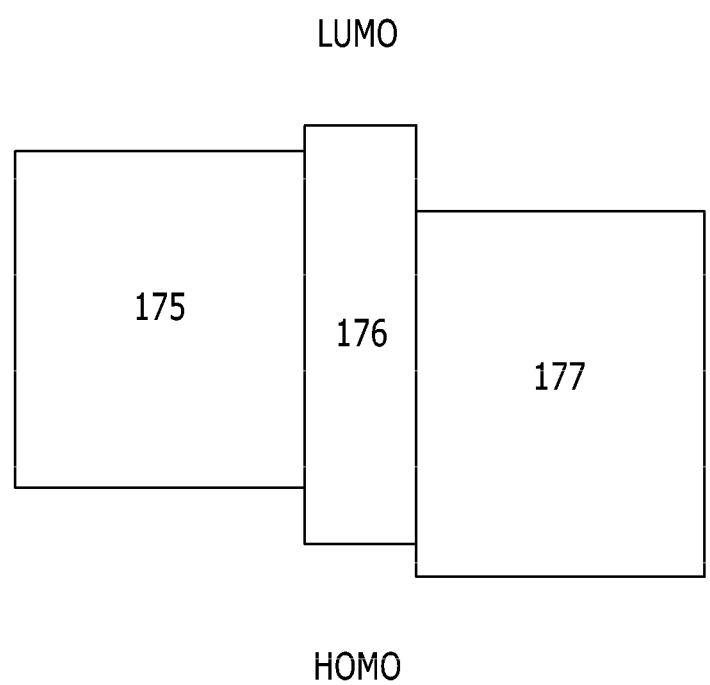
FIG. 3 is a schematic view showing relative energy levels of some of the layers of an organic light emitting element according to an example embodiment of the present disclosure.

FIG. 3 is a schematic view showing a relationship between energy levels of the layers of an organic light emitting element according to an example embodiment of the present disclosure. In more detail, FIG. 3 shows relative energy levels of the emission layer 175, the buffer layer 176, and the electron transport layer 177. Referring to FIG. 3, the LUMO level of the buffer layer 176 is higher than the LUMO level of the emission layer 175 and the LUMO level of the electron transport layer 177. Accordingly, while the electron injection from the electron transport layer 177 into the emission layer 175 may be restricted, the electron injection from the buffer layer 176 into the emission layer 175 may be relatively easy.

Also, electron mobility of the first material included in the buffer layer 176 may be slower than electron mobility of the material included in the electron transport layer 177.

The first material included in the buffer layer 176 according to an example embodiment of the present disclosure may be a spiro fluorene material (e.g., the first material may include a spiro fluorene moiety). In some embodiments, the first material may be a compound represented by at least one selected from Chemical Formula 1 to Chemical Formula 4.

Chemical Formula 1

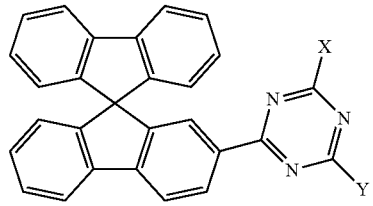

Chemical Formula 2

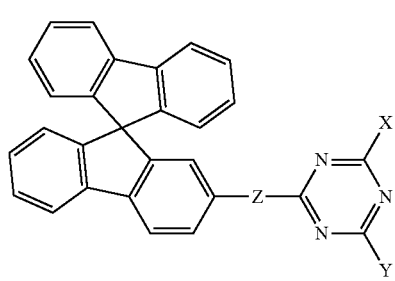

Chemical Formula 3

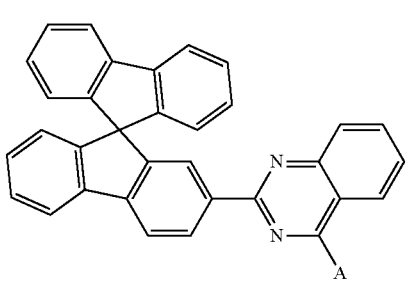

-continued

Chemical Formula 4

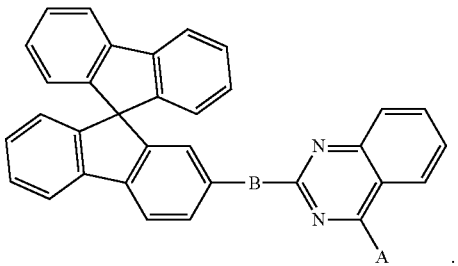

In Chemical Formula 1 and Chemical Formula 2, X and Y may be each independently selected from:

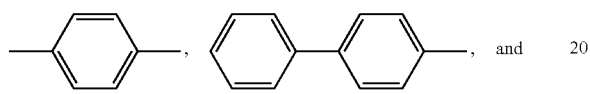

and in Chemical Formula 2, Z may be selected from:

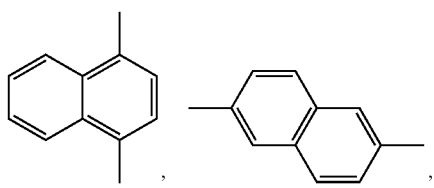

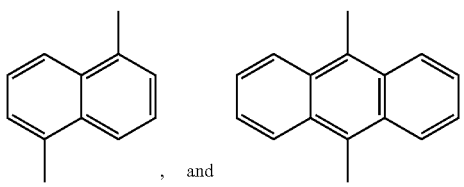

In Chemical Formula 3 and Chemical Formula 4, A may be selected from:

and in Chemical Formula 4, B may be selected from:

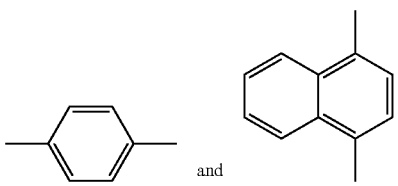

The first material represented by at least one selected from Chemical Formula 1 to Chemical Formula 4 may include a compound represented by at least one selected from Chemical Formula 1-1 to Chemical Formula 1-3, Chemical Formula 2-1 to Chemical Formula 2-4, Chemical Formula 3-1, Chemical Formula 3-2, and Chemical Formula 4-1 to Chemical Formula 4-4, but is not limited thereto.

For example, the first material represented by Chemical Formula 1 may include the compound represented by at least one selected from Chemical Formula 1-1 to Chemical Formula 1-3, the first material represented by Chemical Formula 2 may include the compound represented by at least one selected from Chemical Formula 2-1 to Chemical Formula 2-4, the first material represented by Chemical Formula 3 may include the compound represented by at least one selected from Chemical Formula 3-1 and Chemical Formula 3-2, and the first material represented by Chemical Formula 4 may include the compound represented by at least one selected from Chemical Formula 4-1 to Chemical Formula 4-4.

Chemical Formula 1-1

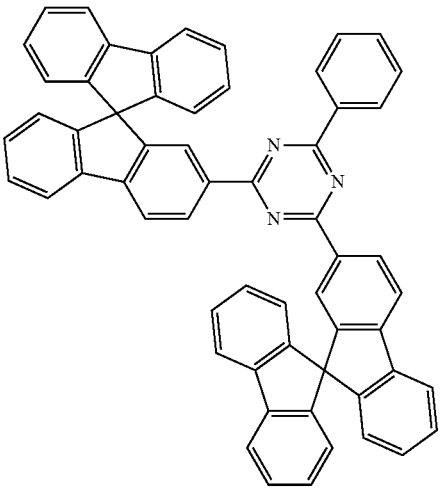

Chemical Formula 1-2
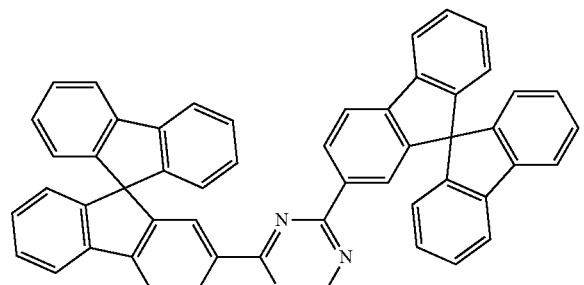
Chemical Formula 1-3
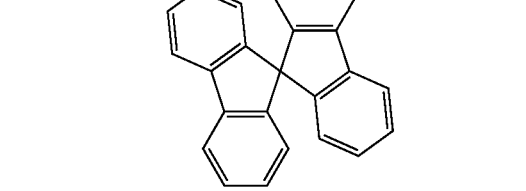
Chemical Formula 2-1
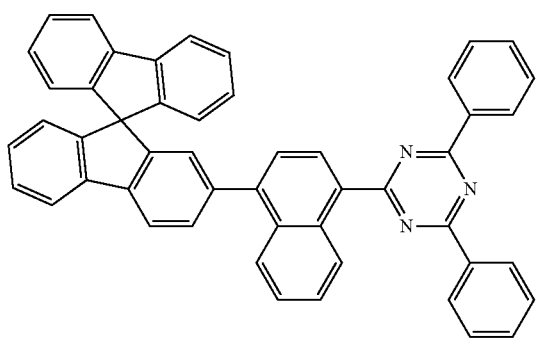
Chemical Formula 2-2
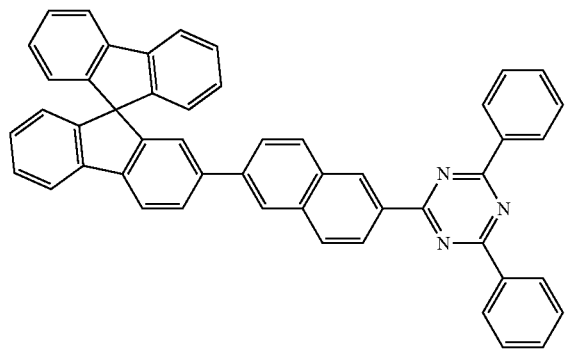
Chemical Formula 2-3
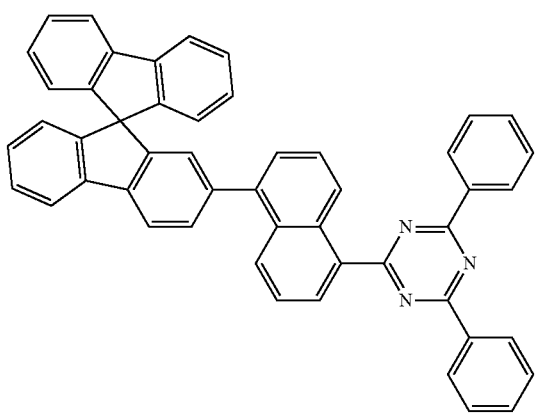
Chemical Formula 2-4
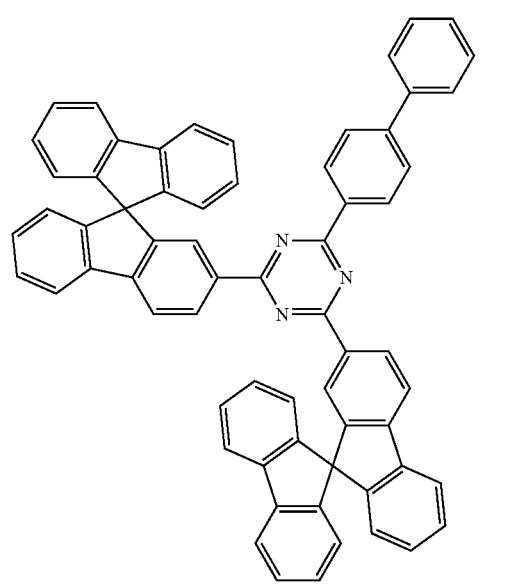
Chemical Formula 3-1
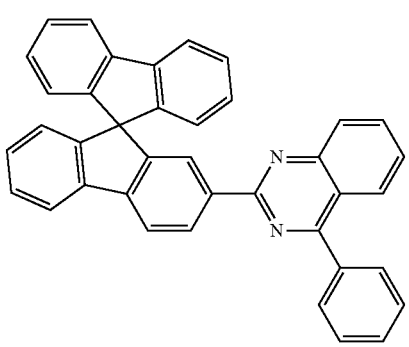

-continued

Chemical Formula 3-2

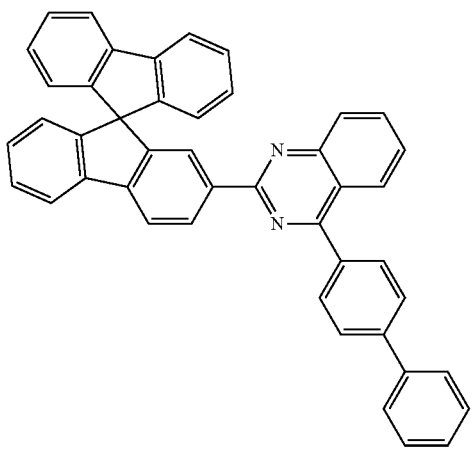

Chemical Formula 4-1

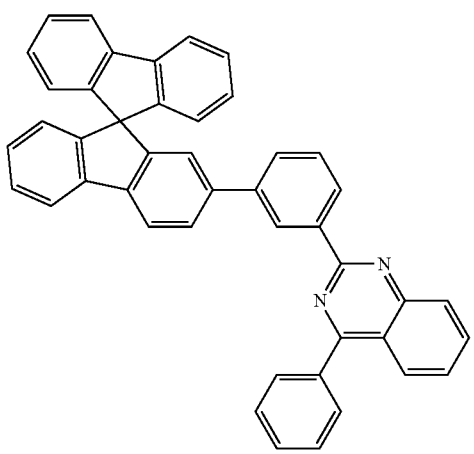

Chemical Formula 4-2

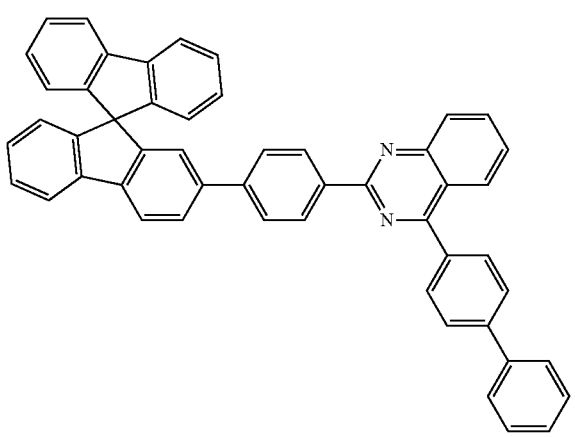

-continued

Chemical Formula 4-3

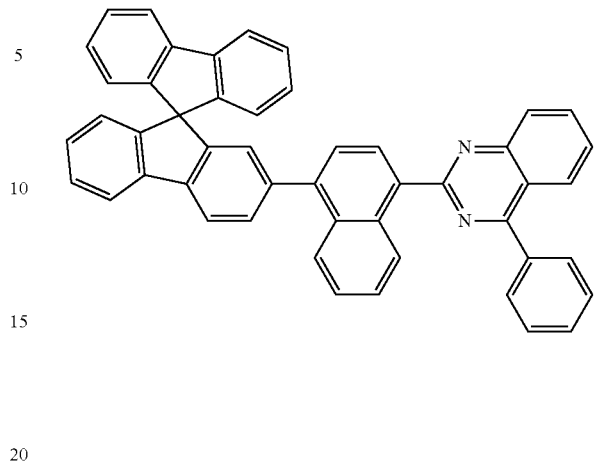

Chemical Formula 4-4

The buffer layer 176 according to an example embodiment of the present disclosure may further include a second material having faster (e.g., higher) electron mobility than the first material. For example, the electron mobility of the second material may be the same (or substantially the same) as the electron mobility of the material included in the electron transport layer 177. By further including the second material, a reduction width of the emission efficiency (e.g., the degree to which the emission efficiency may be reduced) may be controlled in the low gray region of the organic light emitting element according to an example embodiment.

The second material included in the buffer layer 176 according to an example embodiment of the present disclosure may be a material having faster (e.g., higher) electron mobility than that of the first material, and may be selected from suitable electron transport materials having fast electron mobility. In some embodiments, the second material may also be an emission layer host material having this characteristic.

For example, the second material of an example embodiment may be selected from compounds represented by Chemical Formula 5 to Chemical Formula 8, and the buffer layer 176 may include at least one selected from the compounds represented by Chemical Formula 5 to Chemical Formula 8:

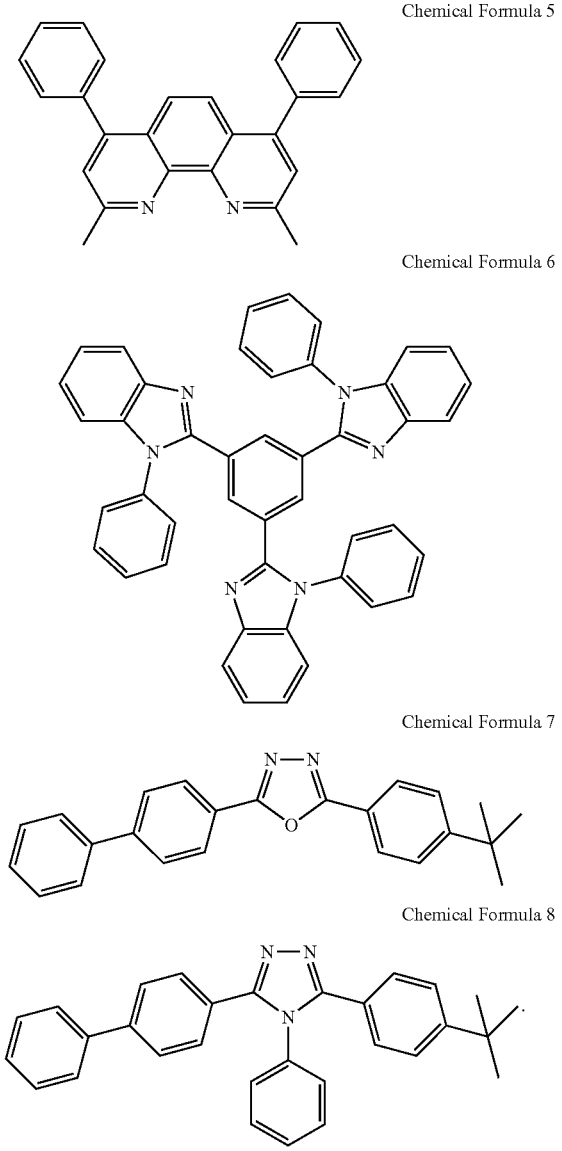

Chemical Formula 5

Chemical Formula 6

Chemical Formula 7

Chemical Formula 8

In an example embodiment, a mixture ratio of the first material and the second material included in the buffer layer 176 may be 1:9 to 9:1. For example, the mixture ratio may be 3:7 to 7:3, however the mixture ratio of the first material and the second material is not limited thereto, and the ratio may be controlled depending on the element efficiency control width (e.g., suitable degree to which the emission efficiency may be reduced) in the low gray region. As used herein, the term "high gray region" may refer to a high brightness gray region on a gray scale, and the term "low gray region" may refer to a low brightness gray region on a gray scale.

The LUMO level and the electron mobility of the buffer layer 176 according to an example embodiment may be controlled by the thickness of the buffer layer 176. For example, the thickness of the buffer layer 176 according to an example embodiment of the present disclosure may be 1 nm to 10 nm. In some embodiments, the thickness of the buffer layer 176 may be 3 nm to 8 nm.

When the thickness of the buffer layer 176 is over 10 nm, the electron injection from the electron transport layer 177 into the emission layer 175 may be excessively limited, and when the thickness is below 1 nm, the effect of the buffer layer 176 of an example embodiment may be slight (e.g., unsuitably low).

Again referring to FIG. 2, the electron transport layer 177 may be positioned on the buffer layer 176. The electron transport layer 177 may transmit electrons from the second electrode 180 to the emission layer 175. In some embodiments, the electron transport layer 177 may prevent or reduce the diffusion of holes injected from the first electrode 160 into the second electrode 180, through the emission layer 175. That is, the electron transport layer 177 may serve as a hole blocking layer, thereby facilitating the combination of the holes and electrons in the emission layer 175. Referring to FIG. 3, since the buffer layer 176 has a higher highest occupied molecular orbital (HOMO) level than that of the electron transport layer 177, the injection of the holes from the emission layer 175 into the electron transport layer 177 may be prevented or reduced.

In some embodiments, the electron transport layer 177 may include an organic material. For example, the electron transport layer 177 may be formed of at least one selected from Alq3 (tris (8-hydroxyquinolino)aluminum), PBD, TAZ, spiro-PBD, BAlq, and SAlq, however, the electron transport layer 177 is not limited thereto.

The second electrode 180 may be positioned on the electron transport layer 177.

When the second electrode 180 is a cathode, the second electrode 180 may include a material having a low work function, so as to facilitate electron injection. For example, the material for forming the second electrode 180 may be selected from metals such as magnesium, calcium, sodium, potassium, titanium, indium, yttrium, lithium, gadolinium, and/or aluminum; tin, lead, cesium, barium, or alloys thereof; or the second electrode 180 may have a multi-layered structure such as LiF/Al, LiO2/Al, LiF/Ca, LiF/Al, and/or BaF2/Ca, but the structure and materials of the second electrode 180 are not limited thereto.

When the second electrode 180 is formed of an alloy, an alloy ratio may be controlled by controlling the temperature of a deposition source, atmosphere, and vacuum level, to select an appropriate (or suitable) ratio.

The second electrode 180 may be formed to have two or more layers.

Figure 4:
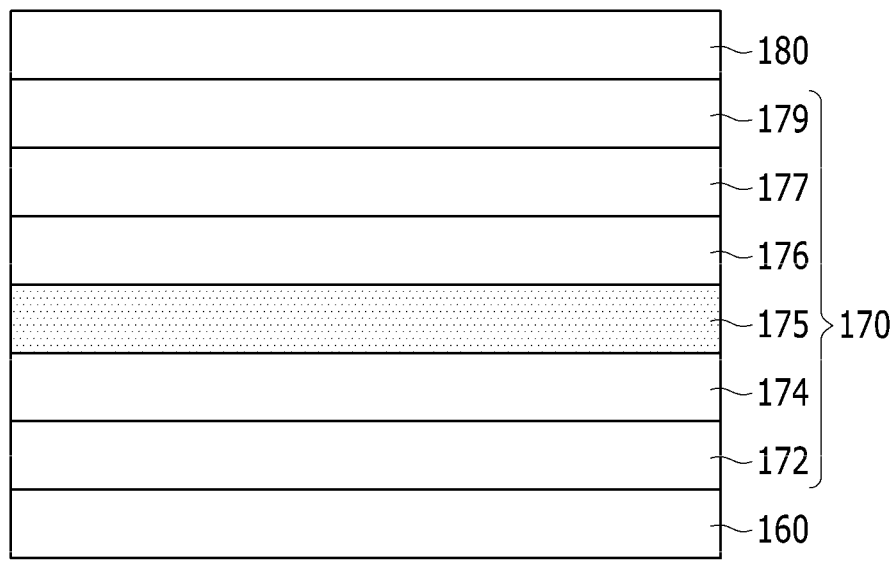
FIG. 4 is a cross-sectional view of a modified example embodiment of the organic light emitting element of FIG. 2.

FIG. 4 is a cross-sectional view of a modified organic light emitting element of FIG. 2, according to another example embodiment of the present disclosure.

Referring to FIG. 4, the organic light emitting element LD according to an example embodiment of FIG. 2 may further include a hole injection layer 172 in the hole transport region, and an electron injection layer 179 positioned between the electron transport layer 177 and the second electrode 180. In the present example embodiment, the hole injection layer 172 is positioned between the hole transport layer 174 and the first electrode 160. The hole injection layer 172 may serve to facilitate the injection of the holes from the first electrode 160 into the hole transport layer 174. In the present example embodiment, the hole injection layer 172 may include a dipole material in which a metal or a non-metal having a work function of at least 4.3 eV is combined with a halogen. However, the hole injection layer 172 is not limited thereto, and may include other inorganic or organic materials.

The metal or the non-metal having a work function of at least 4.3 eV may be at least one selected from Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, and Zn.

The electron injection layer 179 may serve to improve the injection of electrons from the second electrode 180 into the electron transport layer 177.

The thickness of the electron injection layer 179 may be 1 nm to 50 nm.

The electron injection layer 179 according to one embodiment of the present disclosure may include a metal-based halogen dipole material (e.g., a dipole material including a combination of a metal and a halogen). For example, the electron injection layer 179 may include a Group 1 metal, a Group 2 metal, and/or a lanthanide metal selected from Li, Na, K, Rb, Cs, Fr, Be, Mg, Ca, Sr, Ba, Ra, La, Yb, Lu, Tm, Ce, Pr, and Nd, and a halogen element selected from F, Cl, Br, and I.

The electron injection layer 179 may be positioned between the electron transport layer 177 and the second electrode 180.

The electron injection layer 179 may be formed of the single layer including a metal or a metal-based halogen dipole material, or the electron injection layer 179 may be a two-layered structure including the metal and the metal-based halogen dipole material.

The electron injection layer 179 may be formed by using a sputtering method.

The organic light emitting element of the embodiment of FIG. 4 may be substantially similar to the organic light emitting element described in connection with FIG. 2, except for including the above-described additional layers.

Next, the emission efficiency in connection with the gray region (e.g., gray scale) of the organic light emitting element according to an example embodiment of the present disclosure will be described.

In the organic light emitting element according to an example embodiment of the present disclosure, the emission efficiency may be reduced in the low gray region by the buffer layer 176 formed between the emission layer 175 and the electron transport layer 177. This will be described in more detail with reference to Table 1. Table 1 shows the emission efficiency of the organic light emitting element at luminance of 87G and 255G, when the buffer layer 176 is formed on the emission layer 175, according to an example embodiment of the present disclosure.

In this case, in the organic light emitting elements of Example Embodiment 1 and Example Embodiment 2, the buffer layer 176, respectively having the thickness of 5 nm and 10 nm, is provided between the emission layer 175 and the electron transport layer 177. The buffer layer 176 of Example Embodiment 1 and Example Embodiment 2 includes the first material having slower electron mobility than the material of the electron transport layer 177.

In contrast, in the organic light emitting element of Comparative Example 1, the buffer layer 176 is not formed.

TABLE 1

|  | Emission efficiency (cd/A) (For 87G) | Emission efficiency (cd/A) (For 255G) |
| --- | --- | --- |
| Comparative Example 1 | 118 | 107 |
| Example Embodiment 1 | 109 | 103 |
| Example Embodiment 2 | 107 | 104 |

In Table 1, 87G and 255G represent points on the gray gradient scale, where 87G is a point at which a stain is recognized from an initial low gray region and 255G is the required luminance (e.g., brightness) of the brightest gray, and the emission efficiencies of the organic light emitting elements of Examples Embodiments 1 and 2 and Comparative Example 1 at these points are shown.

Figure 5:
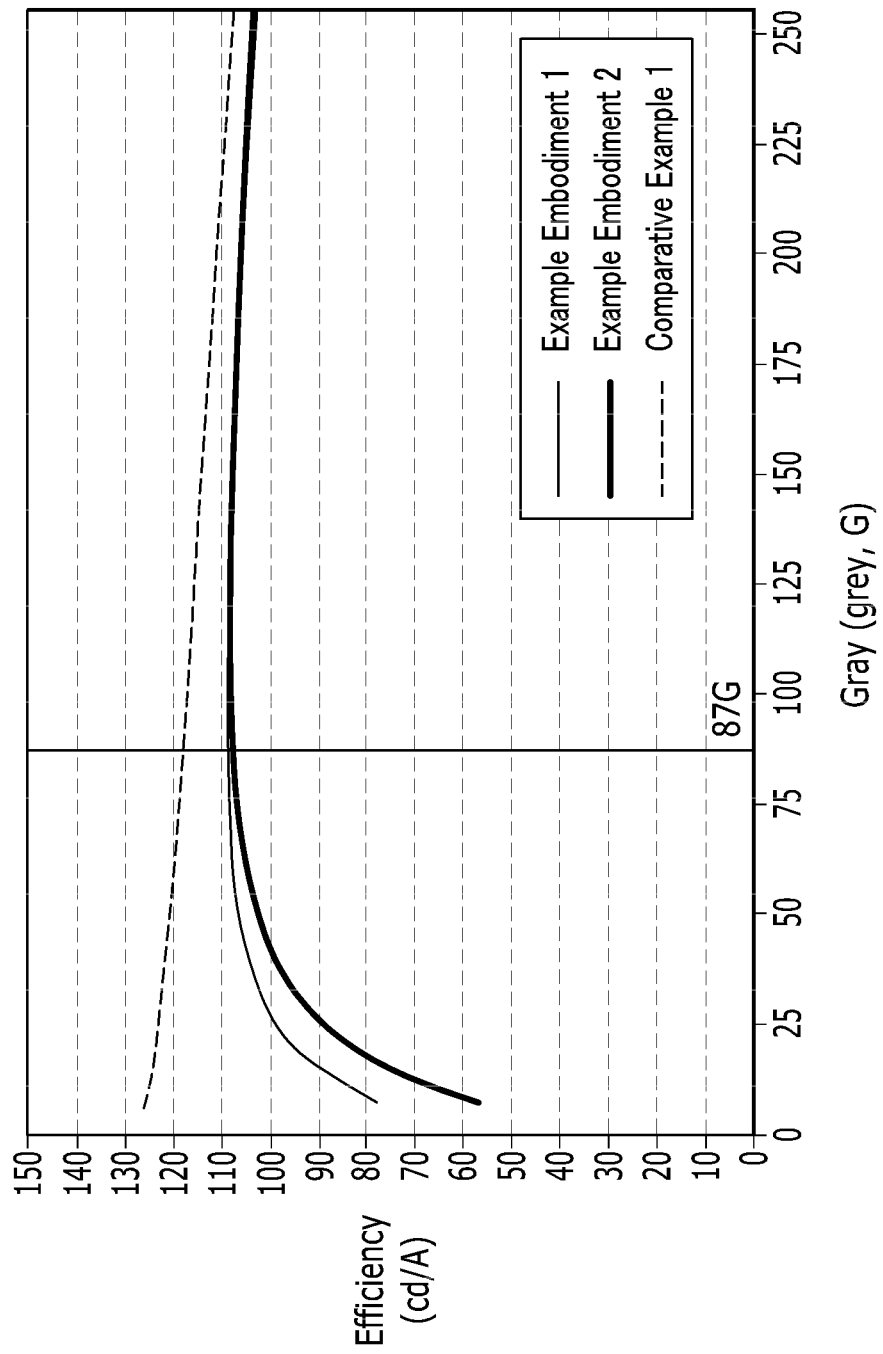
FIG. 5 is a graph showing emission efficiency relative to a gray scale of organic light emitting elements according to Comparative Example 1 and Example Embodiments 1 and 2 of the present disclosure.

FIG. 5 is a graph showing emission efficiency depending on a brightness of gray of an organic light emitting element according to Comparative Example 1 and Example Embodiments 1 and 2 of the present disclosure.

Referring to FIG. 5 along with Table 1, in Example Embodiment 1 and Example Embodiment 2, the emission efficiency from the initial gray to 87G (e.g., in the region between 0 and 87G in FIG. 5) may be effectively reduced, as compared with Comparative Example 1 (e.g., may be lower than the emission efficiency of Comparative Example 1 in the same region). However, although the initial emission efficiency of Example Embodiments is lower than that of the Comparative Example, the emission efficiency of Example Embodiments after 87G (e.g., in the region to the right of 87G in FIG. 5) is substantially the same as that of the Comparative Example 1. That is, according to an example embodiment of the present disclosure, the organic light emitting element may have low efficiency in the low luminance region, such that the stain may not be recognized, and may have high efficiency in the high luminance region.

While the present disclosure is not limited by any particular mechanism or theory, it is believed that the above-described effect is at least in part due to the fact that the amount of self-generated excitons may be controlled by providing the buffer layer 176 to restrict or reduce the electron injection from the electron transport layer 177 into the emission layer 175. Accordingly, as the flow of the charge (e.g., flow of electrons) for each driving region of the organic light emitting element may be controlled, the stain may be controlled in the initial low gray region, and a high device efficiency in the high gray region may be maintained.

When comparing Example Embodiment 1 and Example Embodiment 2, since the thickness of the buffer layer 176 in Example Embodiment 2 is thicker than in Example Embodiment 1, the emission efficiency in the low luminance region of Example Embodiment 2 may be further reduced (e.g., may be lower), as compared with Example Embodiment 1.

Figure 6:
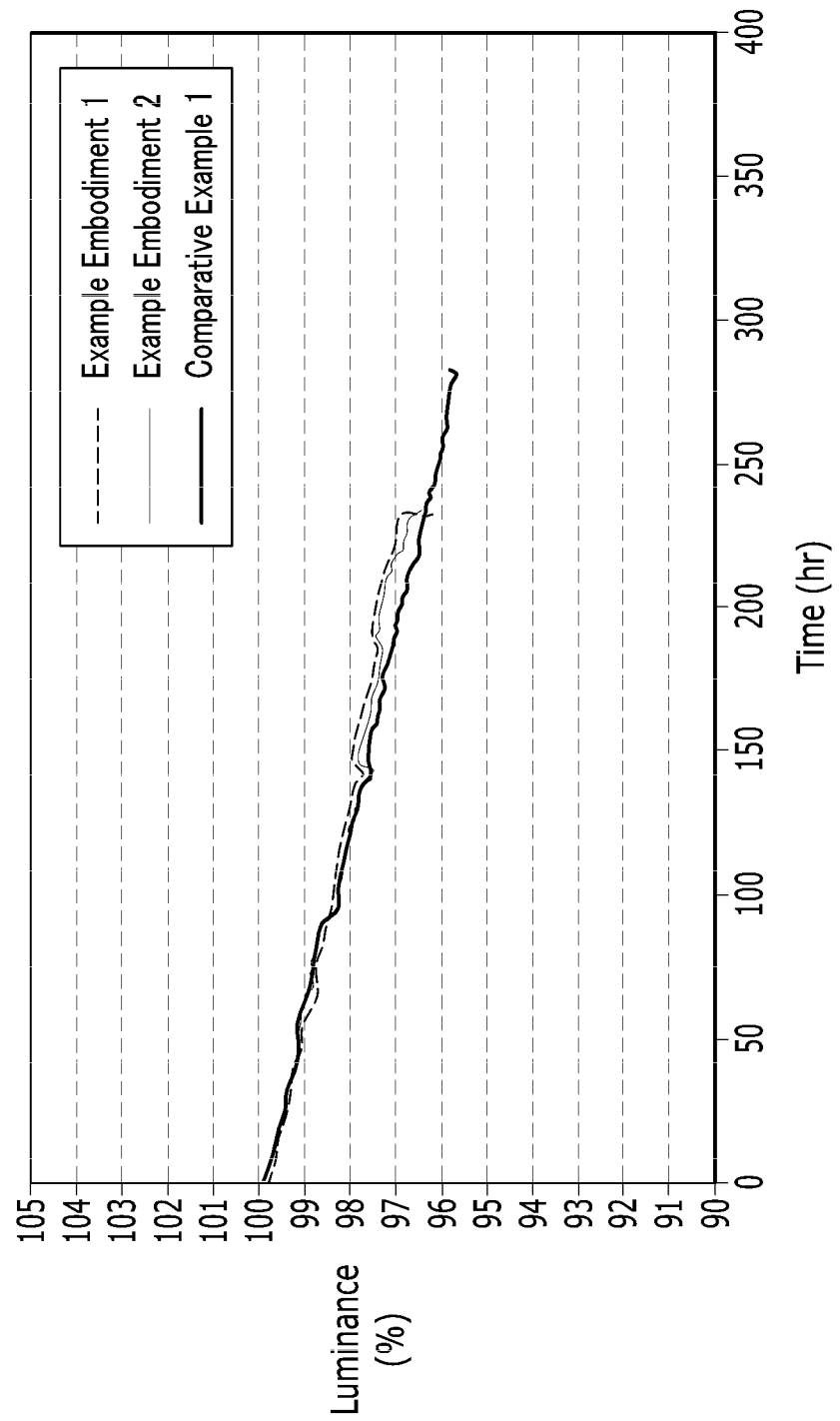
FIG. 6 is a graph showing a lifespan of organic light emitting elements according to Comparative Example 1 and Example Embodiments 1 and 2 of the present disclosure.

FIG. 6 is a graph showing a lifespan of an organic light emitting element according to Comparative Example 1 and Example Embodiments 1 and 2 of the present disclosure. In Example Embodiment 1 and Example Embodiment 2, the lifespan of the organic light emitting element appears to be the same (or substantially the same) as that of the organic light emitting element of Comparative Example 1, although the emission efficiency in the initial low gray region of the Example Embodiments is lower than that of the Comparative Example.

The buffer layer 176 of the organic light emitting element according to an example embodiment of the present disclosure may further include a second material having faster (e.g., higher) electron mobility than the first material, in addition to the first material. In the present example embodiment, the emission efficiency width (e.g., the degree to which the emission efficiency can be reduced) in the low gray region may be appropriately (or suitably) controlled, depending on the electron mobility degree of the second material included in the buffer layer 176 and the mixture ratio of the first material and the second material in the buffer layer 176.

Figure 7:
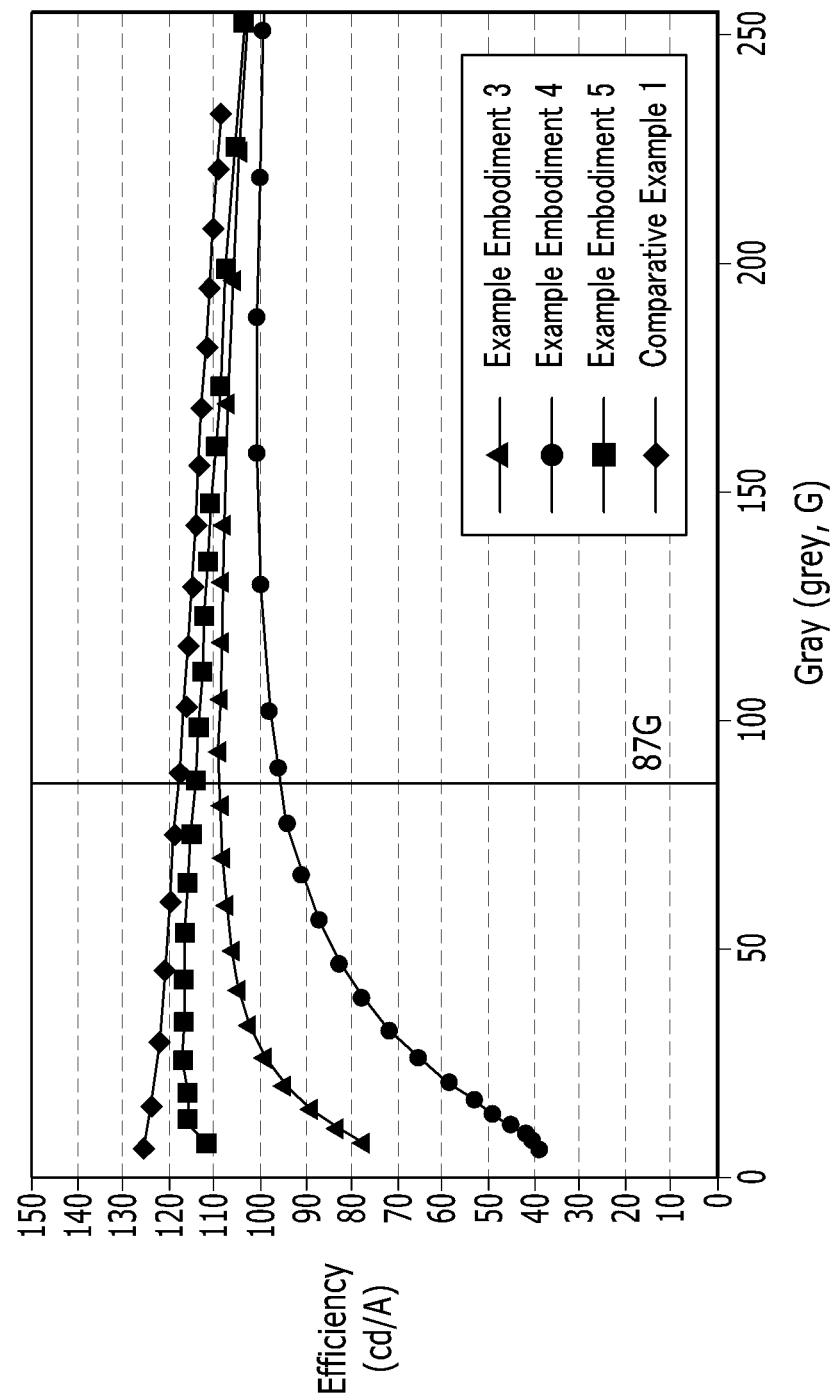
FIG. 7 is a graph showing emission efficiency relative to a gray scale of organic light emitting elements according to Comparative Example 1 and Example Embodiments 3, 4, and 5 of the present disclosure.

FIG. 7 is a graph showing emission efficiency of an organic light emitting element relative to a gray scale, according to Comparative Example 1 and Example Embodiments 3, 4, and 5 of the present disclosure. Organic light emitting elements of Example Embodiments 3, 4, and 5 are substantially the same as the organic light emitting element of Example Embodiment 1, except that the buffer layer further includes a second material, as described below.

In FIG. 7, in Example Embodiment 3, the mixture ratio of the first material and the second material in the buffer layer 176 is 1:1, in Example Embodiment 4, the mixture ratio of the first material is larger than the ratio of the second material, and in Example Embodiment 5, the ratio of the first material is smaller than the ratio of the second material.

Referring to FIG. 7, compared with Comparative Example 1, in Example Embodiments 3 to 5, the emission efficiency from the initial low gray to 87G, at which the stain is initially recognized (e.g., in the region between 0 and 87G in FIG. 7), is reduced (e.g., is lower), compared to that of the Comparative Example 1.

For example, in Example Embodiment 3, the emission efficiency may be effectively (or suitably) reduced in the initial gray region (e.g., in the region between 0 and 87G in FIG. 7), as compared to Comparative Example 1, and the efficiency from 87G to 255G (e.g., in the region between 87G and 255G in FIG. 7) may be maintained at the same (or substantially the same) level as that in Comparative Example 1. In Example Embodiment 4, in which the first material is included in a larger amount than the second material, the emission efficiency in the initial gray region is largely reduced (e.g., is substantially lower than that of Example Embodiment 3). In Example Embodiment 5, in which the second material is included in a larger amount than the first material, the reduction width of the emission efficiency (e.g., the degree to which the emission efficiency is reduced) is smallest in the low gray region, as compared with Example Embodiment 3 and Example Embodiment 4.

According to example embodiments of the present disclosure, in order to effectively (or suitably) control the emission efficiency in the low gray region, the mixture ratio of the first material and the second material in the buffer layer 176 may be 1:9 to 9:1. For example, the mixture ratio of the first material and the second material may be 3:7 to 7:3. However, the mixture ratio of the first material and the second material it is not limited thereto, and may be any suitable ratio capable of controlling the width of the efficiency (e.g., the degree to which the emission efficiency is reduced) in the low gray region.

As used herein, expressions such as "at least one of," "one of," "at least one selected from," and "one selected from," when preceding a list of elements, modify the entire list of elements and do not modify the individual elements of the list. Further, the use of "may" when describing embodiments of the present invention refers to "one or more embodiments of the present invention."

In addition, as used herein, the terms "use," "using," and "used" may be considered synonymous with the terms "utilize," "utilizing," and "utilized," respectively.

As used herein, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims and equivalents thereof.

What is claimed is:

1. An organic light emitting element comprising:

a first electrode and a second electrode facing each other;

an emission layer between the first electrode and the second electrode;

an electron transport layer between the emission layer and the second electrode; and a buffer layer between the emission layer and the electron transport layer, wherein the buffer layer comprises a first material having a lowest unoccupied molecular orbital (LUMO) level that is higher than that of the electron transport layer.

2. The organic light emitting element of claim 1, wherein the difference between the LUMO level of the buffer layer and the LUMO level of the electron transport layer is 0.3 eV or greater.

3. The organic light emitting element of claim 2, wherein the first material is selected from compounds represented by Chemical Formulae 1-1 to 1-3, 2-1 to 2-4, 3 and 4:

Chemical Formula 1-1

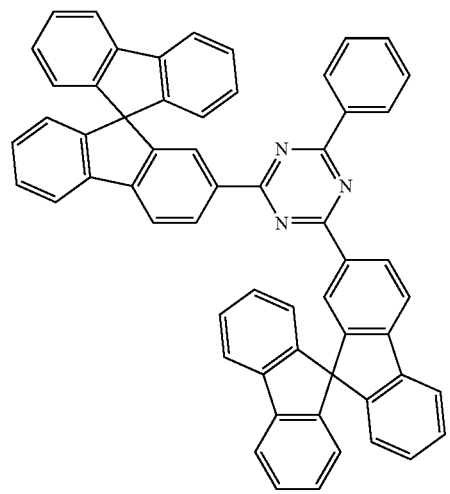

Chemical Foruma 1-2
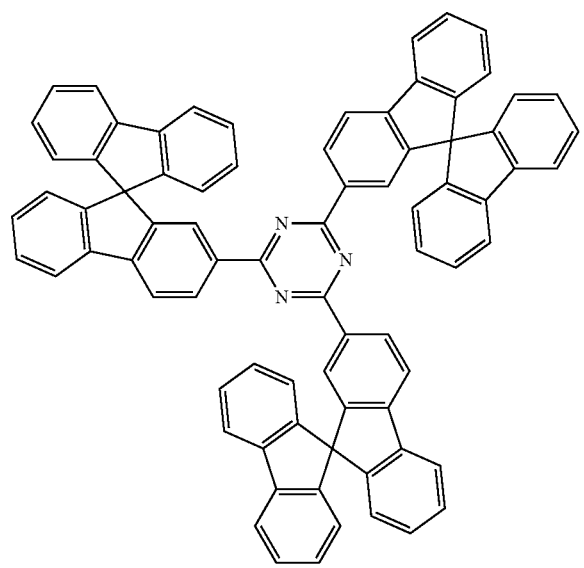
Chemical Formula 1-3
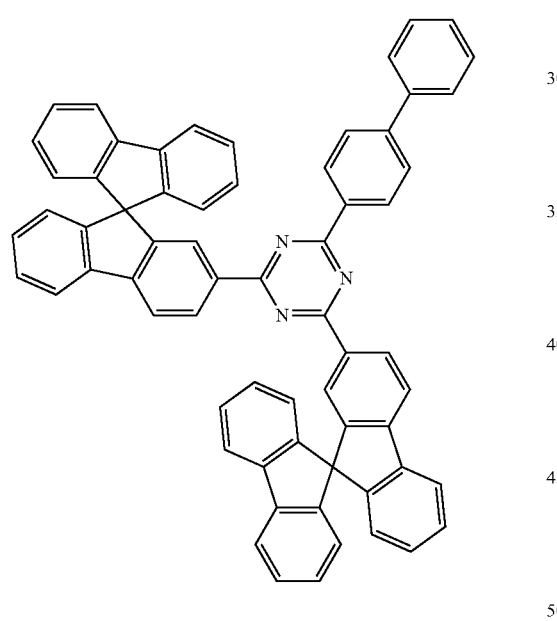
Chemical Formula 2-1
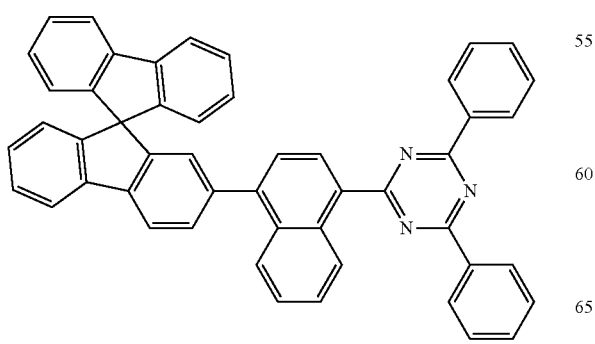
Chemical Formula 2-2
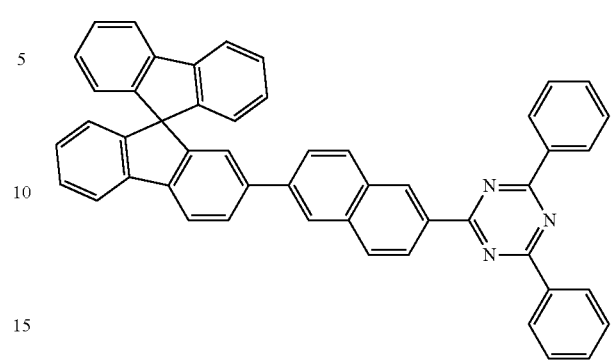
Chemical Formula 2-3
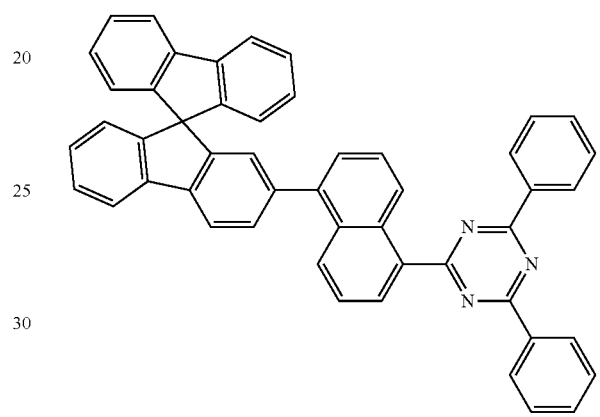
Chemical Formula 2-4
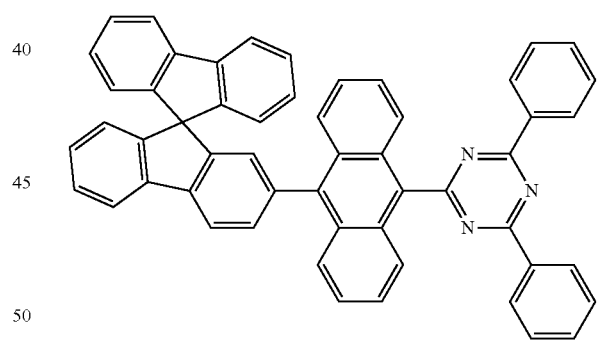
Chemical Formula 3
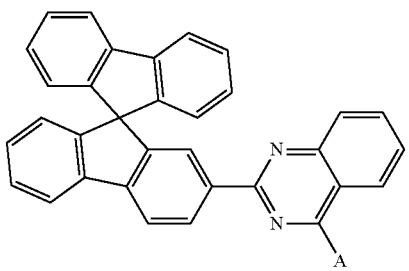

Chemical Formula 4

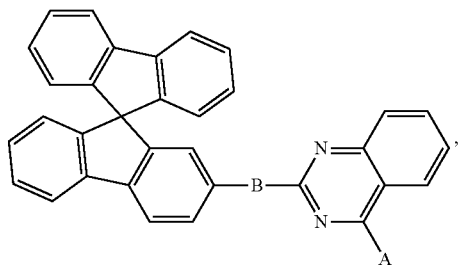

in Chemical Formula 3 and Chemical Formula 4, A is selected from:

and
B in Chemical Formula 4 is selected from:

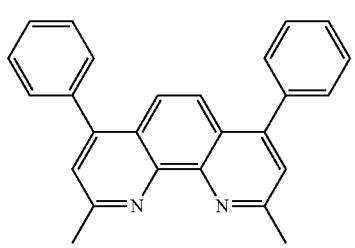

4. The organic light emitting element of claim 1, wherein the buffer layer further includes a second material having faster electron mobility than the first material.

5. The organic light emitting element of claim 4, wherein the second material is selected from compounds represented by Chemical Formulae 5 to 8:

Chemical Formula 5

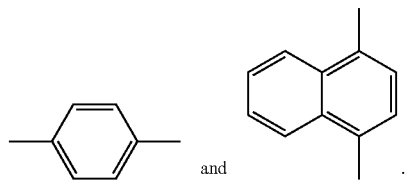

Chemical Formula 6

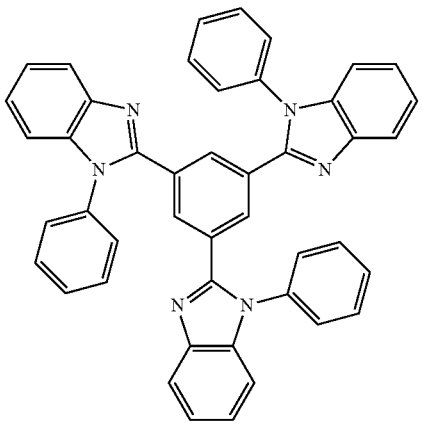

Chemical Formula 7

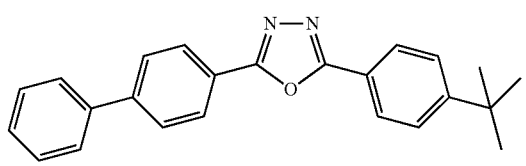

Chemical Formula 8

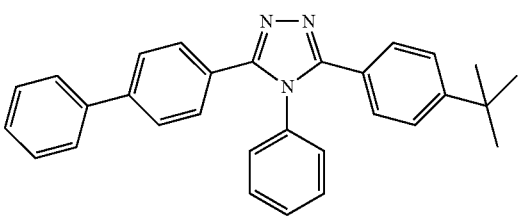

6. The organic light emitting element of claim 5, wherein a mixture ratio of the first material and the second material is 1:9 to 9:1.

7. The organic light emitting element of claim 1, wherein the thickness of the buffer layer is 1 nm to 10 nm.

8. The organic light emitting element of claim 1, further comprising:
an electron injection layer between the electron transport layer and the second electrode; and
a hole transport layer between the first electrode and the emission layer.

9. The organic light emitting element of claim 1, wherein the electron mobility of the first material is slower than the electron mobility of a material included in the electron transport layer.

10. An organic light emitting diode display comprising:
a substrate;
a thin film transistor on the substrate; and
an organic light emitting element coupled to the thin film transistor,
wherein the organic light emitting element comprises:
a first electrode and a second electrode facing each other;
an emission layer between the first electrode and the second electrode;
an electron transport layer between the emission layer and the second electrode; and
a buffer layer between the emission layer and the electron transport layer, and wherein the buffer layer comprises a first material having a lowest unoccupied molecular orbital (LUMO) level that is higher than that of the electron transport layer.

11. The organic light emitting diode display of claim 10, wherein
the difference between the LUMO level of the buffer layer and the LUMO level of the electron transport layer is 0.3 eV or greater.

12. The organic light emitting diode display of claim 11, wherein
the first material is selected from compounds represented by Chemical Formulae 1-1 to 1-3, 2-1 to 2-4, 3, and 4:

Chemical Formula 1-1

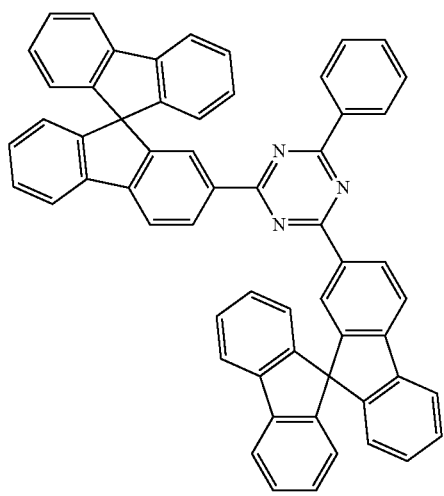

Chemical Foruma 1-2

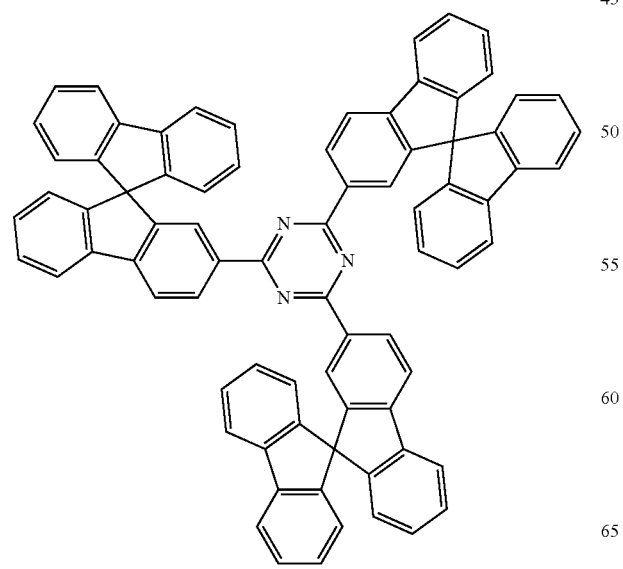

-continued

Chemical Formula 1-3

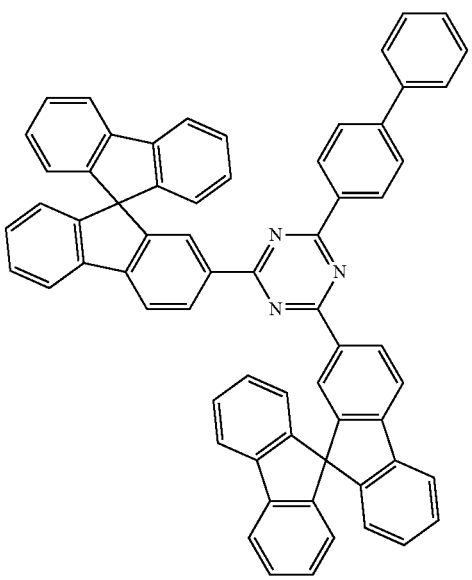

Chemical Formula 2-1

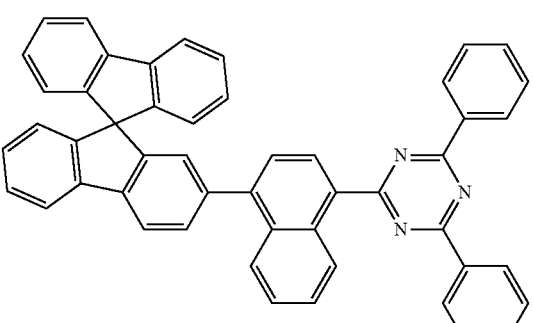

Chemical Formula 2-2

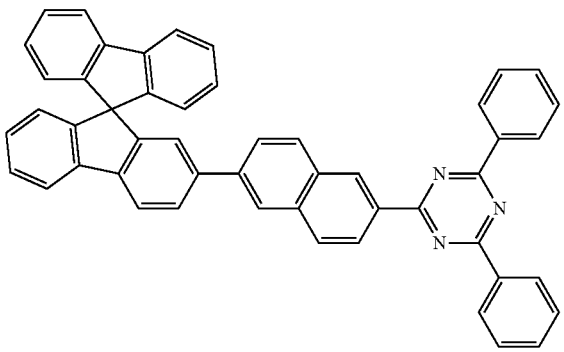

Chemical Formula 2-3

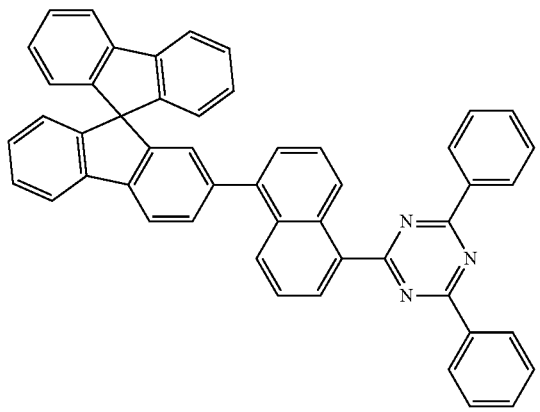

Chemical Formula 2-4

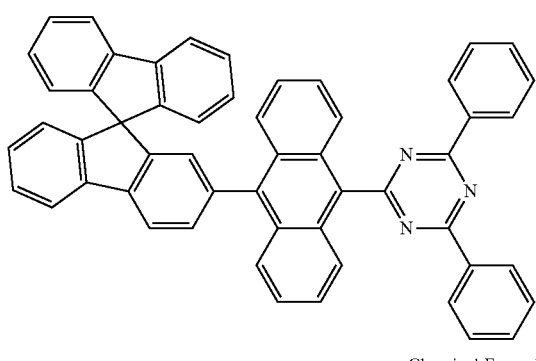

Chemical Formula 3

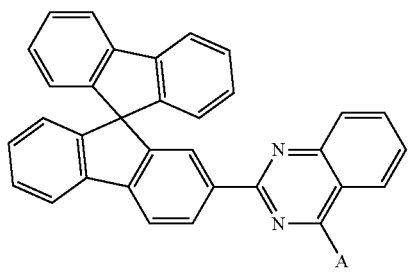

Chemical Formula 4

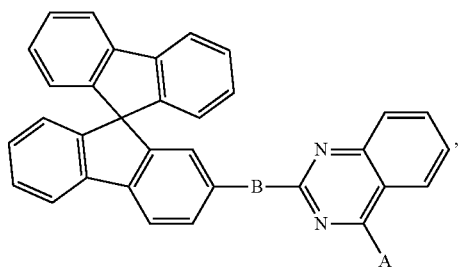

in Chemical Formula 3 and Chemical Formula 4, A is selected from:

and

B in Chemical Formula 4 is selected from:

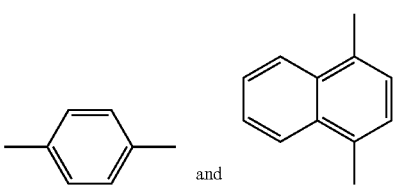

13. The organic light emitting diode display of claim 10, wherein:
the buffer layer further comprises a second material having faster electron mobility than the first material.

14. The organic light emitting diode display of claim 13, wherein
the second material is selected from compounds represented by Chemical Formulae 5 to 8:

Chemical Formula 5

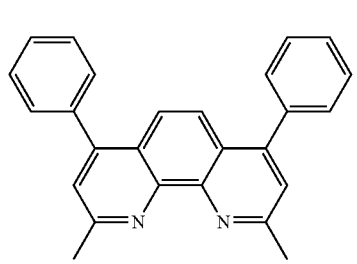

Chemical Formula 6

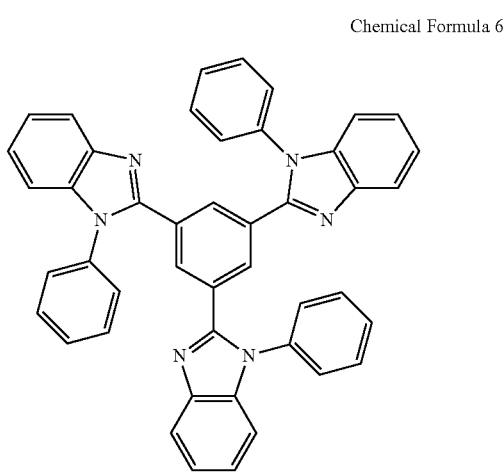

Chemical Formula 7

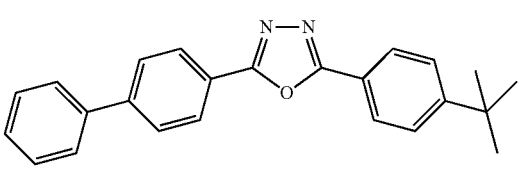

-continued

Chemical Formula 8

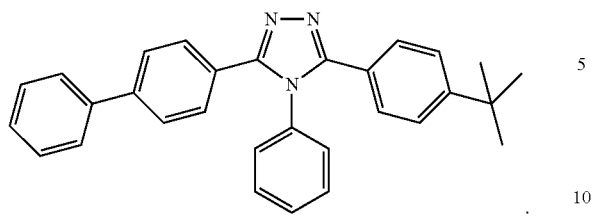

15. The organic light emitting diode display of claim 14, wherein
a mixture ratio of the first material and the second material is 1:9 to 9:1.

16. The organic light emitting diode display of claim 10, wherein
the thickness of the buffer layer is 1 nm to 10 nm.

17. The organic light emitting diode display of claim 16, further comprising:
an electron injection layer between the electron transport layer and the second electrode; and
a hole transport layer between the first electrode and the emission layer.

* * * * *